United States Patent [19]

Tada

[11] Patent Number: 5,545,577
[45] Date of Patent: Aug. 13, 1996

[54] METHOD OF PRODUCING A SEMICONDUCTOR DEVICE HAVING TWO MIS TRANSISTOR CIRCUITS

[75] Inventor: Gen Tada, Kawasaki, Japan

[73] Assignee: Fuji Electric Co., Ltd., Kanagawa, Japan

[21] Appl. No.: 156,847

[22] Filed: Nov. 24, 1993

Related U.S. Application Data

[62] Division of Ser. No. 53,273, Apr. 28, 1993, abandoned.

[30] Foreign Application Priority Data

Apr. 30, 1992 [JP] Japan ................................. 4-111330

[51] Int. Cl.[6] .......................................... H01L 21/70
[52] U.S. Cl. ................... 437/41; 437/41; 437/57
[58] Field of Search .................... 437/41, 57, 43, 437/48, 52, 45, 46, 56, 913, 54, 59; 257/204, 351, 371, 407, 500, 501; 148/DIG. 163

[56] References Cited

U.S. PATENT DOCUMENTS

| | | | |
|---|---|---|---|
| 4,471,373 | 9/1984 | Shimizu et al. | 357/41 |
| 5,057,448 | 10/1991 | Kuroda | 437/52 |
| 5,134,082 | 7/1992 | Kirchgessner | 437/57 |
| 5,183,773 | 2/1993 | Miyata | 437/52 |
| 5,192,992 | 3/1993 | Kim et al. | 257/370 |
| 5,241,208 | 8/1993 | Taguchi | 257/410 |
| 5,272,098 | 12/1993 | Smayling et al. | 437/41 |

FOREIGN PATENT DOCUMENTS

| | | | |
|---|---|---|---|
| 414400A2 | 8/1989 | Japan . | |
| 2-153574 | 6/1990 | Japan . | |
| 1-187063 | 7/1990 | Japan . | |
| 3-214777 | 9/1991 | Japan | 437/56 |

*Primary Examiner*—George Fourson
*Assistant Examiner*—S. Mulpuri
*Attorney, Agent, or Firm*—Finnegan, Henderson, Farabow, Garrett & Dunner, L.L.P.

[57] ABSTRACT

After forming a gate oxide film on the surface side of a single crystalline silicon substrate, a first polycrystalline silicon layer is subsequently formed. After that, portions of polycrystalline silicon layers are left in each gate electrode formation region of a high voltage drive circuit. Then, the gate oxide film in a low voltage drive circuit side is removed while maintaining this state. Then, after forming a gate oxide film on those surface sides, a polycrystalline silicon layer is subsequently formed in the surface side. After that, impurities are introduced into the polycrystalline silicon layer to provide it with electrical conduction, and then portions of polycrystalline silicon layers are left.

3 Claims, 4 Drawing Sheets

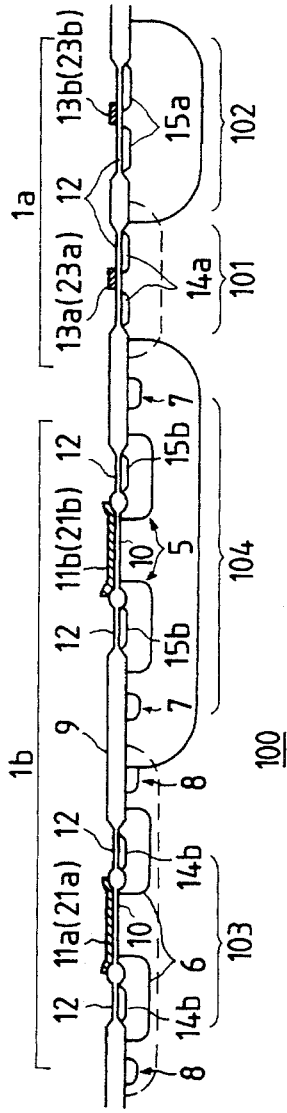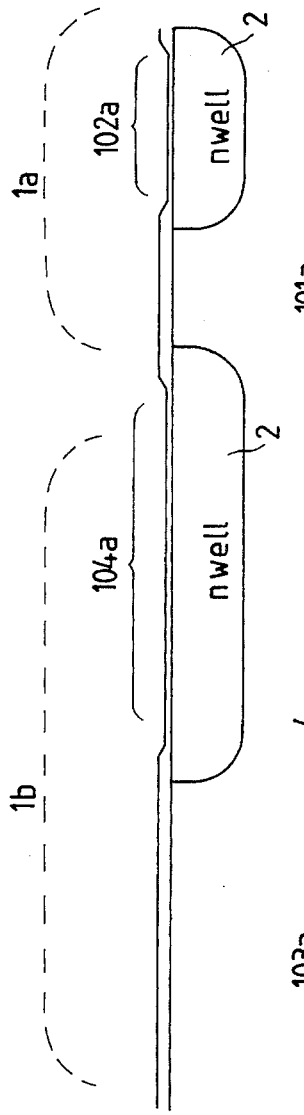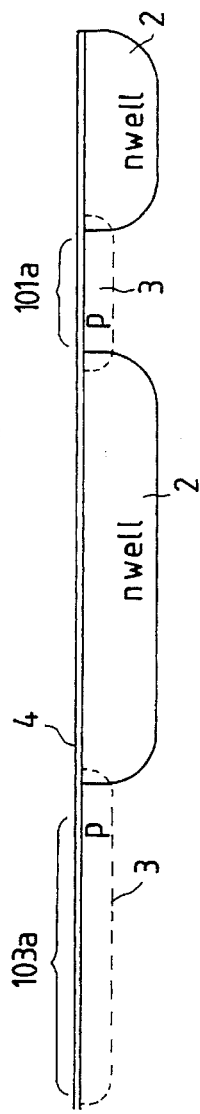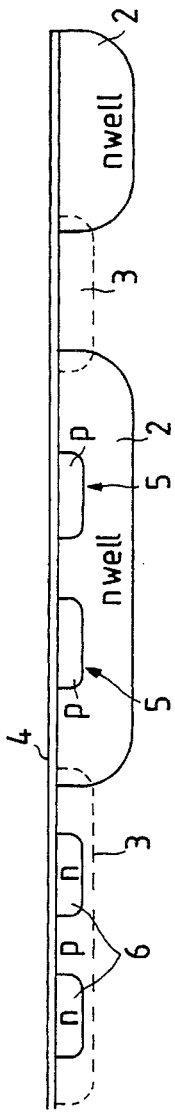
FIG. 1
FIG. 2(a)
FIG. 2(b)
FIG. 2(c)

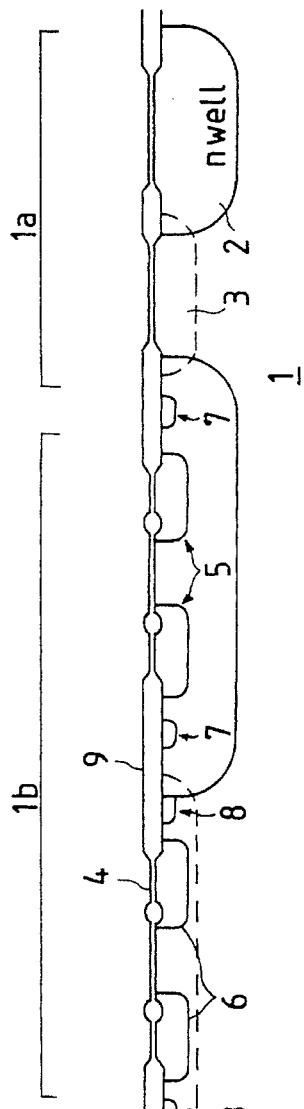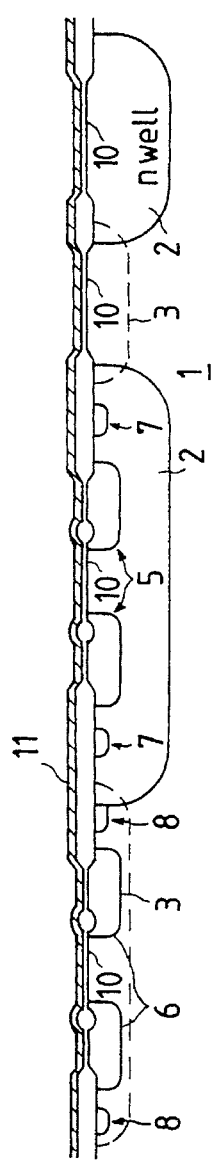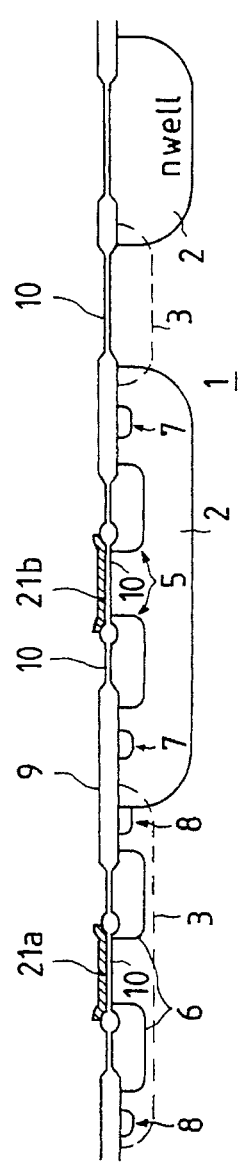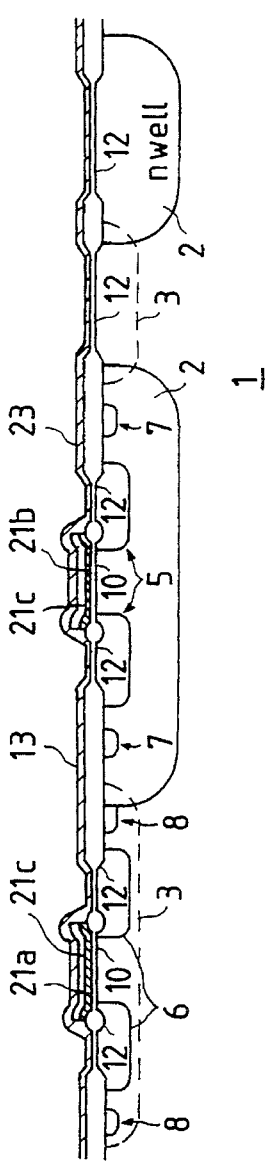
FIG. 3(a)
FIG. 3(b)
FIG. 3(c)
FIG. 3(d)

METHOD OF PRODUCING A SEMICONDUCTOR DEVICE HAVING TWO MIS TRANSISTOR CIRCUITS

This is a division of application Ser. No. 08/053,273, filed Apr. 28, 1993, now abandoned.

BACKGROUND OF THE INVENTION

The present invention relates to a semiconductor device and the method of producing the same, particularly relates to a production technique of a MIS (Metal Insulator Semiconductor) portion for a semiconductor device, which is used, for example, in an integrated circuit for driving a liquid crystal flat panel display.

Many requirements for such an IC as drives a liquid crystal flat panel display (hereinafter referred to as LCD panel) have been made to improve the display property etc. For example, with the enlargement and coloring of the LCD panel, a high withstand voltage in a drive IC have been required to improve the contrast property. Further, with the increase of the amount of information for the display, a high speed operation in a logic circuit portion have been also required. Also, in addition to the improvement of the operation speed of the logic circuit portion, in order to reduce the production cost, it is required to miniaturize the components for down sizing chips. To maintain the withstand voltage of the MOS (Metal Oxide Semiconductor) transistor circuit of the drive IC at such level that an operation can be made at a driving voltage of several tens voltages or more, a structure having a thick gate insulating film is usually used. As can be found from the drive IC 30 for an LCD panel shown in FIG. 5, the thickness of a gate insulating film 34 of a MOSFET 33 in the side of a high voltage drive circuit 30b formed in an n well 32 of a semiconductor substrate 31 is enlarged to enhance the withstand voltage between a gate electrode 36 and source-drain regions 35. However, even in a case where a low voltage drive circuit (logic circuit portion) 30a is formed in a p well 38 in the surface side of the same semiconductor substrate 31, a gate insulating film 39 of a MOSFET 37 in the side of the low voltage drive circuit 30a is formed at the same time when the gate insulating film 34 in the side of the high voltage drive circuit 30b is formed, from the restriction in the process. Thus, the thickness of the gate insulating film 39 unnecessarily becomes large and the current capacity cannot be obtained so that the operation property is deteriorated. In FIG. 5, the reference numerals 40, 41 and 42 respectively denote an intervening insulating film, a p-type offset diffusion region and a source-drain region in the side of the low voltage drive circuit 30a.

Thus, a structure in which the gate insulating films of the low voltage drive circuit side MOSFET and of the high voltage drive circuit side MOSFET have a different thickness respectively, has been investigated. The structure have been disclosed in Japanese Patent Unexamined Publication Nos. 2-153574 and 2-187063. The semiconductor device with such structure is sometimes referred to as a twin gate insulating film structure. For example, the gate insulating films are produced in separate steps through the following process.

First, as shown in FIG. 4(a), both sides of a low voltage drive circuit portion formation region 51 and a high voltage drive circuit portion formation region 52 are wet-oxidized at a temperature of about 800° C. for about 170 minutes to form a gate oxide film 50 having a thickness of about 840 angstroms. Reference numeral 49 denotes a field oxide film.

Next, as shown in FIG. 4(b), a resist layer 56 having a window for regions containing a gate electrode formation region and a contact formation region in the side of the low voltage drive circuit portion formation region 51 is formed. After that, as shown in FIG. 4(b) with a dotted line 58, an ion implantation to a channel formation region is sometimes carried out to control the threshold voltage in accordance with necessity.

Next, as shown in FIG. 4(c), a wet etching using a HF solution is carried out using the resist layer 56 as a mask to remove the gate oxide film 50 formed on the surface of the low voltage drive circuit portion formation region 51.

Next, as shown in FIG. 4(d), the resist layer 56 is removed.

After that, as shown in FIG. 4(e), a wet oxidation is carried out at a temperature of about 800° C. for about 40 minutes as a second gate oxide film formation process, so that a gate oxide film 55 having a thickness of about 250 angstroms is formed on the surface of the low voltage drive circuit portion formation region 51. This oxidation process additionally oxidizes the gate oxide film 50 in the side of the high voltage circuit portion formation region 52 and the thickness of the gate oxide film 50 becomes about 1000 angstroms. After this step, normal steps such as a step of forming a polycrystalline silicon layer to form a gate electrode at both sides of the low voltage drive circuit portion formation region 51 and have voltage drive circuit portion formation region 52 and a step of forming a gate electrode by an etching, are performed so that MOSFETs are formed in the respective regions.

Therefore, in the semiconductor substrate surface side, the gate oxide film thickness in the MOS portion of the low voltage drive circuit portion is about 250 angstroms. On the other hand the gate oxide film thickness in the MOS portion of the high voltage drive circuit portion is about 1000 angstroms. Thus, both a high speed operation in the low voltage drive circuit portion side and a high withstand voltage in the high voltage drive circuit portion side can be realized.

However, in a method of separately forming each gate insulating film by a conventional production process, after the formation of the gate oxide film 50 by a first gate oxide film formation process, the resist layer 56 is formed on the surface side and the gate oxide film 50 in the low voltage drive circuit portion side is removed. Consequently, a deterioration in the withstand voltage property, which is supposed to be caused by contamination of the gate oxide film 50 due to the resist layer, disadvantageously occurs. For example, the deterioration in the withstand voltage to 2 Mv/cm to 6 Mv/cm occur. Further, the TDDB property (aging breakage in the oxide film) showing the aging stability of the gate oxide film 50 is also low and the reliability is low.

SUMMARY OF THE INVENTION

In view of the above-mentioned problems, the object of the present invention is to realize a semiconductor device capable of obtaining a high withstand voltage property and a method of producing the same, in which in forming two MIS (Metal Insulator Semiconductor) transistor circuit portions on the same substrate, even in a case where the formation of the gate insulating films of respective MIS portions in separate steps is needed, one of the gate insulating films is formed in a clean state without being contaminated by the resist layer and the like.

To attain the above-mentioned object, there is provided a method of producing a semiconductor device with a first and a second MIS transistor circuit portion respectively including a first conducting type MIS portion and a second conducting type MIS portion, characterized by having a first step of, after forming a first insulating film on the surface side of a semiconductor substrate, forming a first polycrystalline silicon layer on the surface side, a second step of leaving this polycrystalline silicon layer in each gate electrode formation region of the first and the second conducting type MIS portion of the second MIS transistor circuit portion by etching this polycrystalline silicon layer, a third step of removing the first insulating film of the region containing the gate insulating film formation regions of the first and the second conducting type MIS portions of the first MIS transistor circuit portion in the first insulating film, a fourth step of, after forming a second insulating film on the surface side, forming a second polycrystalline silicon layer on the surface side, and a fifth step of leaving this polycrystalline silicon layer in each gate electrode formation region of the first and the second conducting type MIS portion of the second MIS transistor circuit portion by etching this polycrystalline silicon layer.

In a case where the withstand voltage of the second MIS transistor circuit portion is enhanced, the first insulating film is formed more thickly than in the second insulating film.

Further, when a CMIS structure is formed by the first conducting type and the second conducting type MIS transistor in the first MIS transistor circuit portion, it is preferable that after introducing impurities into the second polycrystalline silicon layer formed in the fourth step, the second polycrystalline silicon layer is etched in the fifth step so that the respective gate electrodes are formed by the same conducting type polycrystalline silicon and the connection therebetween can be easily made.

Further, among the polysilicon layers left in the second step in the respective gate electrode formation regions of the first and the second conducting type MIS portion of the second MIS transistor circuit portion, it is preferable that impurities are introduced at the same time as the step of introducing impurities for forming source and drain diffusion regions of the first conducting type MIS portion, into the polycrystalline silicon layer left in the gate electrode formation region of the first conducting type MIS portion and that impurities are introduced at the same time as the step of introducing impurities for forming source and drain diffusion regions of the second conducting type MIS portion, into the polycrystalline silicon layer left in the gate electrode-formation region of the second conducting type MIS portion. Thus, the conducting type of the second MIS transistor circuit portion is made the same as the conducting type of the gate electrode so that the threshold voltage can be easily controlled.

In a semiconductor device produced by such process, it has a first MIS transistor circuit portion including a first conducting type MIS portion and a second conducting type MIS portion on a surface side of a semiconductor substrate, one of the first conducting type impurity and the second conducting type impurity being introduced into the gate electrode of any MIS portions, and a second MIS transistor circuit portion including a first conducting type MIS portion and a second conducting type MIS portion, the thickness of the gate insulating films of these MIS portions being larger than the thickness of the gate insulating films of the first and the second conducting type MIS portion of the first MIS transistor circuit portion, the gate electrode of the first conducting type MIS portion of these MIS portions being formed of a first conducting type impurity introduced polycrystalline silicon and the gate electrode of the second conducting type MIS portion being formed of a second conducting type impurity introduced polycrystalline silicon. The second MIS transistor circuit portion is used in a circuit side which is driven at a higher drive voltage than in the first MIS transistor circuit portion.

In the method of producing the semiconductor device according to the present invention, in the first step, after forming a first insulating film on the surface side of a semiconductor substrate, a first polycrystalline silicon layer is formed on the surface side, and in the second step, this polycrystalline silicon layer is left in each gate electrode formation region of the first and the second conducting type MIS portion of the second MIS transistor circuit portion by etching this polycrystalline silicon layer. Then, to form a gate oxide film by another step in the first MIS transistor circuit portion, in third step, the first insulating film of the region containing the gate insulating film formation region of the first and the second conducting type MIS portion of the first MIS transistor circuit portion in the first insulating film is removed. However, since the first polycrystalline silicon layer is disposed on the first insulating film surface side, the resist layer is not in direct contact with the first insulating film. Then, in the fourth step, after forming a second insulating film on the surface side, a second polycrystalline silicon layer is formed on the surface side. Then, in the fifth step, this polycrystalline silicon layer is left in each gate electrode formation region of the first and the second conducting type MIS portion of the first MIS transistor circuit portion by etching the second polycrystalline silicon layer. Therefore, any gate insulating film is covered with a polycrystalline silicon layer in a clean state just after the formation thereof and the gate insulating films are formed in separate steps without being in contact with the resist layer. Thus, contamination etc. due to the resist layer does not occur and the withstand voltage property of the gate insulating film and the reliability i.e. the withstand voltage property and the reliability of the MIS transistor circuit portion can be improved.

BRIEF DESCRIPTION OF THE DRAWINGS

FIG. 1 is a schematic cross sectional view showing a structure of a semiconductor device according to an embodiment of the present invention, FIGS. 2(a) to 2(c) are step cross sectional views showing a part of the first steps of the production process of the semiconductor device shown in FIG. 1, FIGS. 3(a) to 3(d) are step cross sectional views showing a part of the remaining steps of the production process of the semiconductor device shown in FIG. 1, FIGS. 4(a) to 4(e) are step cross sectional views showing a part of a production process of a conventional semiconductor device.

DETAILED DESCRIPTION OF THE INVENTION

Figures 4A, 4B, 4C, 4D, 4E:
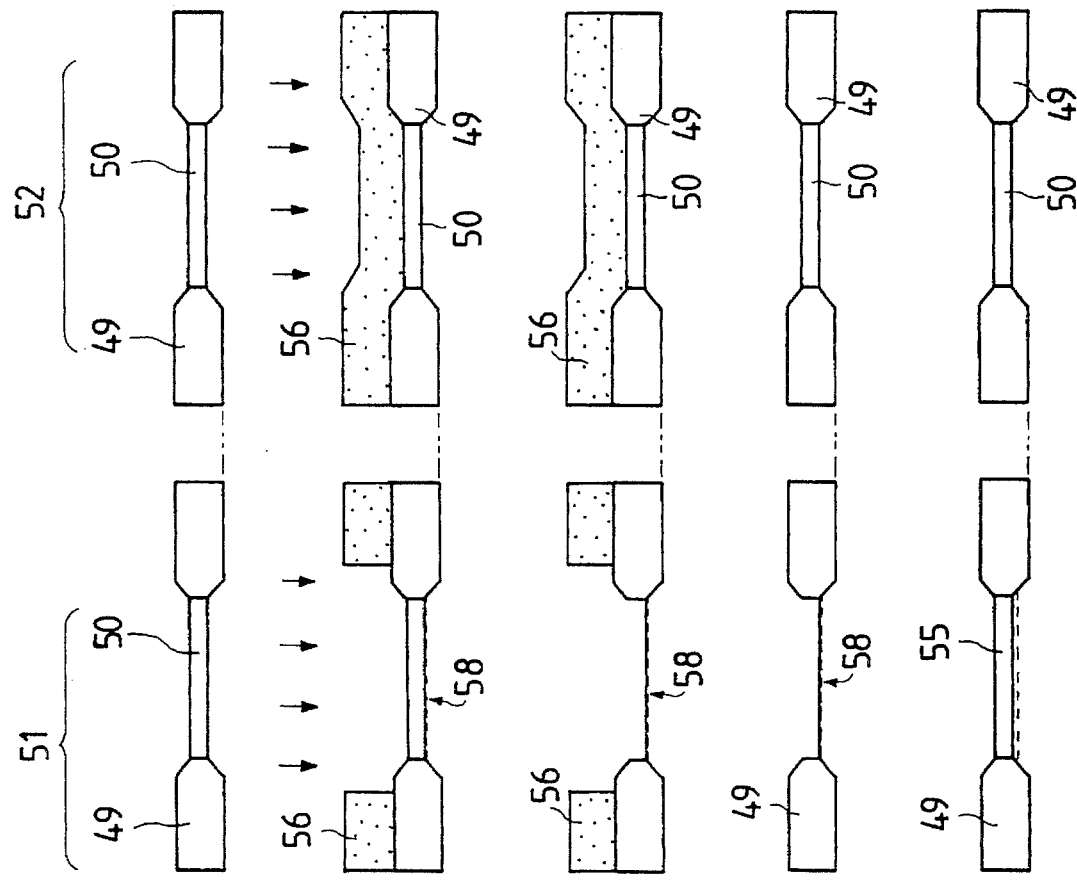
Figure 5:
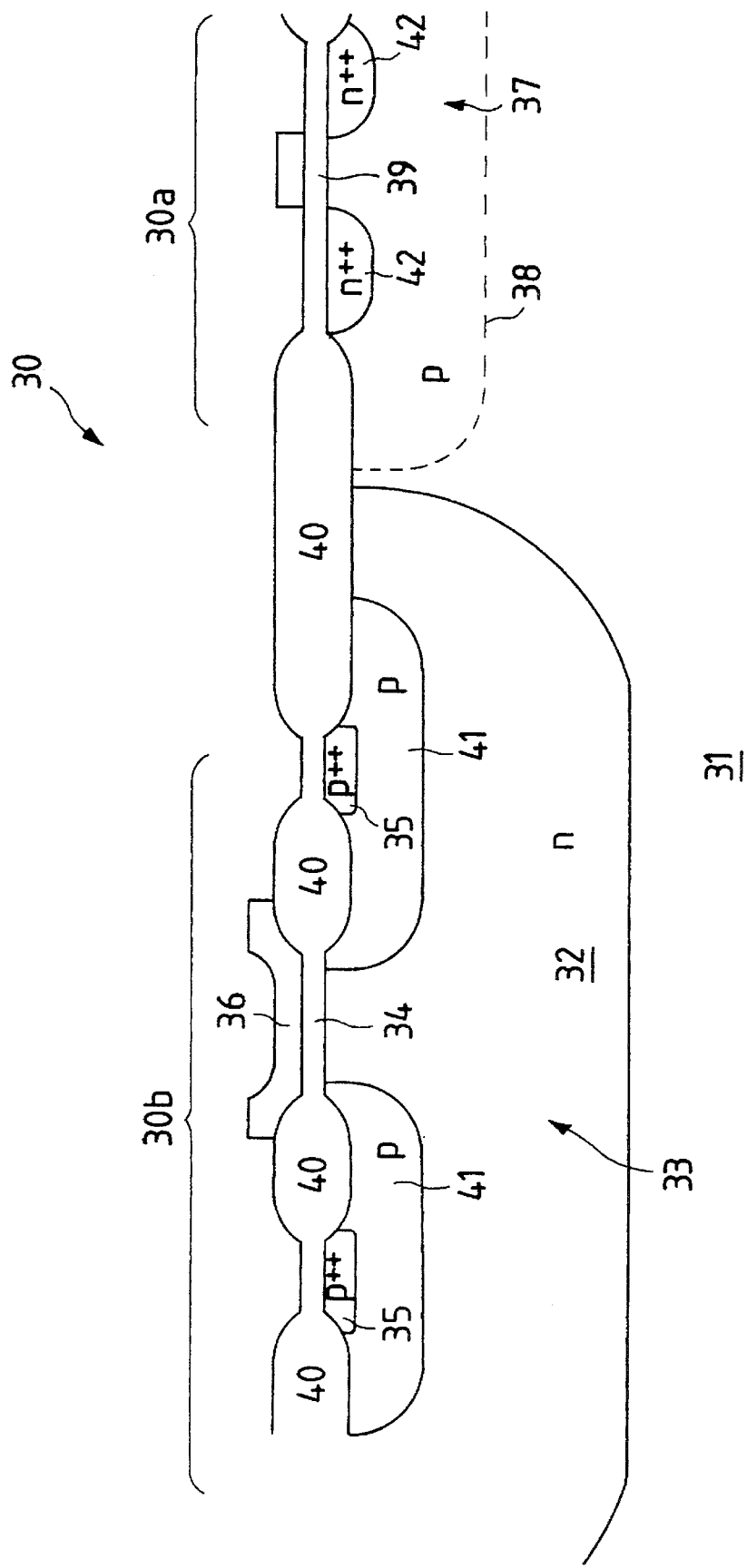
FIG. 5 is a cross sectional view showing a structure of another conventional semiconductor device.

Preferred embodiments of the present invention will now be described with reference to the attached drawings.

FIG. 1 is a cross sectional view showing a structure of a semiconductor device according to an embodiment of the present invention.

FIG. 1 shows a semiconductor device 1 of the present embodiment, which is an IC for driving a liquid crystal flat panel display having a low voltage drive circuit portion 1a (a first MIS transistor circuit portion) driven by a drive voltage of 5 v or less as a logic circuit and a high voltage drive circuit portion 1b (a second MIS transistor circuit portion) driven by a drive voltage of several tens v or more in the surface side of the same single crystalline silicon substrate 100 (a semiconductor substrate). In this case, the low voltage drive circuit portion 1a has a low voltage n channel type (first conducting type) MOSFET 101 which is composed of a CMOS structure and a low voltage p channel type. (second conducting type) MOSFET 102. On the other hand, the high voltage drive circuit portion 1b has a high voltage n channel type (first conducting type) MOSFET 103 which is composed of a CMOS structure and a high voltage p channel type (second conducting type) MOSFET 104. The low voltage n channel type MOSFET 101 is formed in the n well surface side of the single crystalline silicon substrate 100 and has a gate insulating film 12 having a thickness of about 250 angstroms, a gate electrode 13a of n type impurity doped polycrystalline silicon and an $n^+$ type source-drain region 14a. The low voltage p channel type MOSFET 102 is formed in the p well surface side of the single crystalline silicon substrate 100 and has a gate insulating film 12 having a thickness of about 250 angstroms, a gate electrode 13b of n type impurity doped polycrystalline silicon and a $p^+$ type source-drain region 15a. On the other hand, the high voltage n channel type MOSFET 103 is formed in the n well surface side of the single crystalline silicon substrate 100 and has a gate insulating film 10 having a thickness of about 1300 angstroms or more, a gate electrode 11a of n type impurity doped polycrystalline silicon and an $n^+$ type source-drain region 14b formed in the surface side of an n type offset diffusion layer 6. The high voltage p channel type MOSFET 104 is formed in the p well surface side of the single crystalline silicon substrate 100 and has a gate insulating film 10 having a thickness of about 1300 angstroms or more, a gate electrode 11b of p type impurity doped polycrystalline silicon and a $p^+$ type source-drain region 15b formed in the surface side of a p type offset diffusion layer 5. Reference numerals 7, 8 and 9 denote an $n^+$ type guard ring, a $p^+$ type guard ring and a field oxide film, respectively. In FIG. 1, regions 12 other than gate oxide films are those formed at the same time together with the gate oxide film 12.

In this embodiment, the gate oxide film 12 in the low voltage drive circuit portion 1a side has a thickness of about 250 angstrom. Both the low voltage n channel type MOSFET 101 and the low voltage p channel type MOSFET 102 in the low voltage drive circuit portion 1a are operated at a high speed. On the other hand, the gate oxide film 10 in the high voltage drive circuit portion 1b side has a thickness of about 1300 angstroms. Both the low voltage n channel type MOSFET 103 and the low voltage p channel type MOSFET 104 in the high voltage drive circuit portion 1b are operated at a high withstand voltage.

Since both the gate oxide film 12 in the low voltage drive circuit portion 1a side and the gate oxide film 10 in the high voltage drive circuit portion 1b side have not been brought into contract with the resist layer in the production process, those are not contaminated and the withstand voltage property and the reliability etc. are high. The production process of the gate oxide films will be described hereinafter.

A method of producing the semiconductor device 1 having such structure will be described with reference to FIGS. 2 and 3. FIGS. 2(a) to 2(c) and FIGS. 3(a) to 3(d) are schematic process cross .sectional views partially showing the production process according to the embodiment of the present invention.

First, as shown in FIG. 2(a), a czp (100) single crystalline silicon substrate 100 having a specific resistance of 10 ohm cm is prepared and impurities are introduced into the p channel type MOSFET formation regions 102a and 104a in any sides of the low voltage drive circuit portion 1a an the high voltage drive circuit portion 1b in the single crystalline silicon substrate 100 and diffused to form an n well 2 having a depth of about 7 micrometers.

Next, as shown in FIG. 2(b), impurities are introduced into the n channel type MOSFET formation regions 101a and 103a in any sides of the low voltage drive circuit porion 1a and the high voltage drive circuit portion 1b in the single crystalline silicon substrate 100 and diffused to form a p well 3 having a depth of about 2 micrometers. During this diffusion process, a base oxide film 4 having a thickness of about 400 angstroms is formed on the surface of the single crystalline silicon substrate 100.

Next, as shown in FIG. 2(c), a p type offset diffusion layer 5 having a depth of 1.5 micrometers is formed in the p channel type MOSFET formation region 104a in the sourse-drain formation region of the high voltage drive circuit portion 1b and an n type offset diffusion layer 6 having a depth of 1.5 micrometers is formed in the n channel type MOSFET formation region 103a.

Then, as shown in FIG. 3(a), $n^+$ guard rings 7 and $p^+$ guard rings 8 are formed in order to isolate the high voltage MOSFET which is formed in the high voltage drive portion 1b. After that, a selective oxidation is carried out using a silicon nitride as a mask to form a field oxide film 9.

Then, after removing the base oxide film 4, as shown in FIG. 3(a), a wet oxidation is carried out at a temperature of about 900° C. for 70 minutes to from a thick gate oxide film 10 (first insulating film) having a thickness of about 1300 angstroms, which is needed for a MOSFET formed in the high voltage drive circuit portion 1b. Then, on the surface side of the gate oxide film 10 is formed a first polycrystalline silicon layer 11 having a thickness of 4500 angstroms by a CVD process. After that, a thermal oxidation is carried out at a temperature of about 900° C. so that the surface side of the first polycrystalline silicon layer 11 is changed to a silicon oxide film (not shown) (first step).

Then, on the surface side of the first polycrystalline silicon layer 11 is formed a resist layer. Then after patterning, dry etching and removing the resist layer, polycrystalline silicon layer 21a and 21b which are to be formed into the gate electrodes 11a and 11b are left only in a desired region of the high voltage drive circuit portion 1b (second step).

Then, using non-doped polycrystalline silicon layers 21a and 21b in the high voltage drive circuit portion 1b as a mask, a wet etching is carried out by use of HF solution and gate oxide film 10 in a gate electrode formation region and a contact formation region in the low voltage drive circuit portion 1a is removed (third step).

After that, a wet oxidation of those surface sides is carried out at a temperature of about 800° C. for 40 minutes to form a gate oxide film 12 (second insulating film) having a thickness of about 250 angstroms as shown in FIG. 3(d). During this step, the surface side of the polycrystalline silicon layers 21a and 21b which are to be formed into the gate electrodes 11a and 11b in the high voltage drive circuit portion 1b are oxidized to form a silicon oxide film 21c. The polycrystalline silicon layers 21a and 21b are more easily oxidized than the surface side of the single crystalline substrate 100. The thickness of the silicon oxide film 21c is about 400 angstroms. Subsequently, on the surface side of the gate oxide film 12 and the silicon oxide film 21c is formed a second polycrystalline silicon layers 23 having a thickness of 4500 angstroms by the CVD process. After that, a highly concentrate phosphorus is doped into the entire surface of the second polycrystalline silicon layers 23 so as to provide the second polycrystalline silicon layers 23 with an n type conducting property (fourth step).

Then, on the surface side of the second polycrystalline silicon layer 23 is formed a resist mask layer. Then after patterning, dry etching and removing the resist layer, polycrystalline silicon layers 23a and 23b (gate electrodes 13a and 13b) are left only in a desired region of the low voltage drive circuit portion 1a. Since the polycrystalline silicon layers 23a and 23b have already been electrically conducted in the previous step, the layers become the gate electrodes 13a and 13b as they are. Since in this dry etching, the silicon oxide film 21c is disposed on the surface of the polycrystalline silicon layers 21a and 21b left in the high voltage drive circuit portion 1b side, when a dry etching is stopped by the use of the gate oxide film 12, the polycrystalline silicon layers 21a and 21b in the high voltage drive circuit portion 1b side remain without being etched. Since the dry etching selection ratio of silicon to silicon oxide film is about 10:1, if the gate oxide film 12 and the silicon oxide film 21c are exposed at the time when etching to the second polycrystalline silicon layer 23 is ended, the etching rate is rapidly lowered so that the end point of the etching for the second polycrystalline silicon layer 23 can be controlled (fifth step).

Consequently, in the low voltage drive circuit porion 1a and the high voltage drive circuit portion 1b sides are formed gate oxide films 10 and 12 having different thickness to each other by separate steps.

The subsequent production steps of the MOSFET will be described with reference to FIG. 1. First, while using the polycrystalline silicon layers 21a and 21b (the gate electrodes 11a and 11b) and the gate electrodes 13a and 13b as masks, ion implantation to both sides of the low voltage drive circuit porion 1a and the high voltage drive circuit portion 1b are carried out sequentially so that the respective source-drain diffusion regions 14a, 15a, 14b and 15b are formed with self alignment for the low voltage drive circuit portion 1a and the high voltage drive circuit portion 1b. After this ion implantation process, the polycrystalline silicon layers 21a and 21b of the high voltage drive circuit portion 1b are electrically conducted to form the same conducting type gate electrodes 11a and 11b as the corresponding source-drain diffusion region 14a and 15a. After that, a contact hole formation step, a wiring formation step and a protecting film formation step are carried out sequentially so that a low voltage n channel type MOSFET 101 and a low voltage p channel type MOSFET 102 are formed in the low voltage drive circuit portion 1a side. On the other hand, a high voltage n channel type MOSFET 103 and a high voltage p channel type MOSFET 104 are formed in the high voltage drive circuit portion 1b side.

Since any one of the gate electrodes 13a and 13b of the low voltage n channel type MOSFET 101 and a low voltage p channel type MOSFET 102 are polycrystalline silicon layers in which phosphorus has already been doped at a high concentration, in the low voltage drive circuit portion 1a, the amount of the ion-implanted impurities to form the source-drain diffusion region 14a and 15a does not influence on the conducting type. Thus, even after the formation of the source-drain diffusion regions 14a and 15a, the gate electrodes 13a and 13b are n conducting type polycrystalline silicon layer. Therefore, when a CMOS structure is composed of the low voltage n channel type MOSFET 101 and the low voltage p channel type MOSFET 102, electrical connection has no restriction. For example, the gate electrode 13a can be electrically connected to the gate electrode 13b directly without through aluminum electrode. Thus, the structural design of the low voltage drive circuit portion 1a etc. can be easily made and the miniaturization can be also easily realized with the result that the chip area of the semiconductor device 1 can be miniaturized.

On the other hand, the gate electrode 11a of the high voltage n channel type MOSFET 103 in the high voltage drive circuit portion 1b side is the n type impurity doped and electrically conducted polycrystalline silicon layer, and the type of the impurity is the same, and is introduced at the same time, as the impurity introduced in the source-drain diffusion region 14b in the formation step of the sourse-drain diffusion region 14b. Further, the gate electrode 11b of the high voltage p channel type MOSFET 104 in the high voltage drive circuit portion 1b side is the p type impurity doped and electrically conducted polycrystalline silicon layer, and the type of the impurity is the same, and is introduced at the same time, as the p type impurity introduced in the source-drain diffusion region 15b in the formation step of the source-drain diffusion region 15b. Namely, in the high voltage drive circuit portion 1b side, the gate electrode 11a of the high voltage n channel type MOSFET 103 and the gate electrode 11b of the high voltage p channel type MOSFET 104 are composed of different conducting type polycrystalline silicon layers thereby forming the two conducting type gate electrode structure. Thus, since in both sides of the high voltage n channel type MOSFET 103 and the high voltage p channel type MOSFET 104, the conducting types of the channel formation region and the gate electrodes 11a an 11b are the same, the variation in the threshold voltage derived from the difference of mutual work functions so that the control of the threshold voltage can be easily made. Additionally, the gate electrode 11b is a p type to correspond to the high voltage p channel type MOSFET 104, so that the threshold voltage can be more easily controlled than in an n type gate electrode. Thus, threshold voltage can be lowered by for example, 0.5 v. Furthermore, the easiness in threshold voltage control is capable of omitting the channel doping step so that the masking step is not required with the result that the improvement of the productivity and low cost can be realized.

Further, in the production process of the present embodiment, after forming the gate oxide film 10 on the surface side of the single crystalline silicon substrate 100, the first polycrystalline silicon layer 11 is formed subsequently. After that, th polycrystalline silicon layers 21a and 21b are left in each gate electrode formation region of the high voltage drive circuit portion 1b. Further, since in the low voltage drive circuit 1a side, the gate oxide film 12 having different thickness must be formed in a separate step, the gate oxide film 10 in the low voltage drive circuit 1a side is removed. However, since on the surface side of the gate oxide film 10, the first polycrystalline silicon layer 11 is formed, the resist layer and the etching agents are not directly brought into contact with the gate oxide film 10. Then, after forming the gate oxide film 12 in the fourth step, the polycrystalline silicon layer 13 is formed on the surface side. Then, the second polycrystalline silicon layer 23 is etched in the fifth step so that the polycrystalline silicon layers 23a and 23b are left in each gate electrode formation region of the low voltage drive circuit 1a. Therefore, any gate oxide films 10 and 12 are covered with the polycrystalline silicon layers 11 and 23 while maintaining the clean state in just after the formation, with the result that the gate oxide films having different thicknesses can be formed in separate steps without contacting with the resist layer. Thus, the contamination due to the resist does not occur and the withstand voltage property of the gate oxide films 10 and 12 and the reliability, i.e., the withstand voltage and the reliability of the semiconductor device 1 can be improved.

In the low voltage drive circuit 1a side, the gate electrodes 13a and 13b can be made of boron doped p type polycrystalline silicon layer.

As described above, according to the present invention, the first insulating film is formed in the surface side of the semiconductor substrate. Then, the first polycrystalline silicon layer is formed. After that, the polycrystalline silicon layer is etched to leave the polycrystalline silicon layer to be formed into the gate electrode of the second MIS transistor circuit portion and on the other hand, while keeping this state, the etching for the first insulating film is carried out. Then, after forming the second insulating film on the surface side, the second polycrystalline silicon layer is formed and the polycrystalline silicon layer is etched. Therefore, any insulating films (gate oxide films) are covered with a polycrystalline silicon layer in a clean state just after the formation thereof. When the gate oxide film in unnecessary region is removed, the surface side is covered with polycrystalline silicon and it is not brought into contact with the resist layer. Consequently, since any gate insulating films can be formed in separate steps without being in contact with the resist layer, the contamination etc. due to the resist does not occur and the withstand voltage property of the gate insulating film and the reliability, i.e., the withstand voltage property of the MIS transistor circuit portion and the reliability can be effectively improved.

When the first insulating film was formed in a larger thickness than the second insulating film, the MIS transistor circuit side having a thick insulating film as the gate insulating film acts as the high voltage drive circuit thereby obtaining enhanced withstand voltage property. In this case, since the gate insulating film of other MIS transistor circuit can be thinly formed, the operation speed is not decreased.

Further, when, after introducing impurities to the second polycrystalline silicon layer, this polycrystalline silicon layer is etched to form the gate electrode, different conducting type gate electrodes of the MIS portion can be electrically conducted in a simple structure. Thus, the margin of the design of the semiconductor device is enhanced and miniaturization thereof can be easily made.

Furthermore, when the gate electrode of the first conducting type MIS portion is formed as the first conducting type and the gate electrode of the second conducting type MIS portion is formed as the second conducting type in the second MIS transistor circuit portion side, the threshold voltage can be easily controlled. Therefore, the channel doping step can be omitted and the improvement in the productivity and the low cost can be realized.

What is claimed is:

1. A method of producing a semiconductor device including, on a surface side of a semiconductor substrate, a first MIS transistor circuit portion with a first-conducting-type first MIS portion and a second-conducting-type second MIS portion, and a second MIS transistor circuit portion with a first-conducting-type third MIS portion and a second-conducting-type fourth MIS portion, comprising:

a first step of, after forming a first insulating film on said surface side of said semiconductor substrate, forming a first polycrystalline silicon layer on a surface side of said first insulating film without being in contact with any resist layer;

a second step of leaving portions of said first polycrystalline silicon layer, in which impurities have not been injected, in respective gate electrode formation regions of said first conducting-type third MIS portion and said second-conducting-type fourth MIS portion of said second MIS transistor circuit portion by etching said first polycrystalline silicon layer;

a third step of removing portions of said first insulating film in gate insulating film formation regions of said first-conducting-type first MIS portion and said second-conducting-type second MIS portion of said first MIS transistor circuit portion;

a fourth step of, after forming a second insulating film on a surface side of said substrate, forming a second polycrystalline silicon layer on a Surface side of said second insulating film; and a fifth step of leaving portions of said second polycrystalline silicon layer in respective gate electrode formation regions of said first-conducting-type first MIS portion and said second-conducting-type second MIS portion of said first MIS transistor circuit portion by etching said second polycrystalline silicon layer, wherein impurities are introduced at the same time and for the first time as a step of introducing impurities for forming a source diffusion region and a drain diffusion region of said third MIS portion, into said first polycrystalline silicon layer left in the second step in said gate electrode formation region of said first-conducting-type third MIS portion of said second MIS transistor circuit portion, and impurities are introduced at the same time and for the first time as a step for introducing impurities for forming a source diffusion legion and a drain diffusion region of said fourth MIS portion, into said polycrystalline silicon layer left in the second step in said gate electrode formation region of said second-conducting-type fourth MIS portion.

2. A method of producing a semiconductor device according to claim 1, wherein said first insulating film is formed to have a larger thickness than said second insulating film.

3. A method of producing a semiconductor device according to claim 1 or 2, wherein, after introducing impurities into said second polycrystalline silicon layer formed in said fourth step, said second polycrystalline silicon layer is etched in said fifth step.

* * * * *

UNITED STATES PATENT AND TRADEMARK OFFICE
CERTIFICATE OF CORRECTION

PATENT NO. : 5,545,577
DATED : August 13, 1996
INVENTOR(S) : Gen TADA

It is certified that error appears in the above-indentified patent and that said Letters Patent is hereby corrected as shown below:

Claim 1, Column 10, line 28, "Surface" should read --surface--.

Claim 1, Column 10, line 45, "legion" should read --region--.

Signed and Sealed this

Fourteenth Day of January, 1997

Attest:

BRUCE LEHMAN

Attesting Officer

Commissioner of Patents and Trademarks